United States Patent
Okabe

(10) Patent No.: US 10,659,050 B2
(45) Date of Patent: May 19, 2020

(54) LEVEL SHIFTER AND SEMICONDUCTOR DEVICE

(71) Applicant: Winbond Electronics Corp., Taichung (TW)

(72) Inventor: Sho Okabe, Taichung (TW)

(73) Assignee: WINBOND ELECTRONICS CORP., Taichung (TW)

(\*) Notice: Subject to any disclaimer, the term of this patent is extended or adjusted under 35 U.S.C. 154(b) by 0 days.

(21) Appl. No.: 16/284,141

(22) Filed: Feb. 25, 2019

(65) Prior Publication Data

US 2019/0267998 A1 Aug. 29, 2019

(30) Foreign Application Priority Data

Feb. 26, 2018 (JP) .................................. 2018-031480

(51) Int. Cl.
| | |
|---|---|
| H03K 19/0175 | (2006.01) |
| H03K 19/0185 | (2006.01) |
| H03K 3/356 | (2006.01) |
| G11C 8/08 | (2006.01) |
| G11C 16/12 | (2006.01) |
| H03K 3/012 | (2006.01) |

(52) U.S. Cl.
CPC ....... *H03K 19/018521* (2013.01); *G11C 8/08* (2013.01); *G11C 16/12* (2013.01); *H03K 3/012* (2013.01); *H03K 3/356113* (2013.01)

(58) Field of Classification Search
None
See application file for complete search history.

(56) References Cited

U.S. PATENT DOCUMENTS

| | | | | |
|---|---|---|---|---|
| 6,344,764 | B2* | 2/2002 | Tanzawa | .................. G11C 8/08 |
| | | | | 326/68 |
| 7,245,152 | B2* | 7/2007 | Wich | ..................... H03K 3/012 |
| | | | | 326/62 |
| 2004/0090259 | A1* | 5/2004 | Randazzo | ........ H03K 3/356113 |
| | | | | 327/333 |

(Continued)

FOREIGN PATENT DOCUMENTS

| | | |
|---|---|---|
| JP | 4098322 B2 | 6/2008 |
| JP | 2012070333 A | 4/2012 |

(Continued)

*Primary Examiner* — Anh Q Tran
(74) *Attorney, Agent, or Firm* — Muncy, Geissler, Olds & Lowe, P.C.

(57) ABSTRACT

A level shifter includes a pair of cross-coupled PMOS transistors, intrinsic-type NMOS transistors, an input node, a control circuit and an output node. A high voltage is supplied to the PMOS transistors. The intrinsic-type NMOS transistors and the PMOS transistors are respectively coupled in serial. The input node is configured to receive input signals. The control circuit is triggered by the voltage Vdd and is configured to generate enable signals and control signals according to the input signal. The output node is configured to output the high Voltage HV or the GND voltage as the output signal. After the node aa is charged, the transistor HVNI_1 is turned off according to the control signal SW to avoid leakage current being generated. After the node MOUT is charged, the transistor HVNI_2 is turned off according to the control signal SWb to avoid leakage current being generated.

14 Claims, 5 Drawing Sheets

(56) References Cited

U.S. PATENT DOCUMENTS

| | | | | |
|---|---|---|---|---|
| 2007/0247209 A1* | 10/2007 | Chen | ................ | H03K 3/356104 327/333 |
| 2008/0238522 A1* | 10/2008 | Thorp | .............. | H03K 3/356182 327/333 |
| 2008/0238523 A1* | 10/2008 | Thorp | ................ | H03K 3/35613 327/333 |
| 2010/0109743 A1* | 5/2010 | Czech | .............. | H03K 3/356113 327/333 |
| 2011/0032785 A1 | 2/2011 | Cho | | |
| 2012/0063233 A1 | 3/2012 | Lee et al. | | |
| 2016/0365849 A1* | 12/2016 | Moscaluk | ........... | G11C 11/2297 |

FOREIGN PATENT DOCUMENTS

| | | | |
|---|---|---|---|
| JP | 2017228325 A | 12/2017 | |
| TW | I541807 B | 7/2016 | |

\* cited by examiner ably high as compared to the transistors driven by the voltage Vdd, and therefore, the drain current is small. For example, when the voltage level of the signal ENb is Vdd, the voltage at the node aa is pulled down to the GND voltage via the transistor MVN_1, the voltage at the node MOUT is pulled up from the high voltage HV side via the transistor MVP_2. However, because the voltage at the gate of the transistor MVN_1 only reaches the level of the voltage Vdd, the time required to charge and discharge the nodes aa and MOUT is increased. In addition, when the charge pump is not working, the level of the high voltage HV becomes the same level as the voltage Vdd. For example, when the voltage at the node MOUT is pulled up from the high voltage HV side via the transistor MVP_2, because the level of the voltage at the source of the transistor MVP_2 only reaches the level of the voltage Vdd, the time required for discharging the node MOUT is increased.

To solve the problem in the conventional design, a level shifter capable of operating in high speed and reducing power consumption is provided.

Apparatuses for Solving Problems

According to an embodiment of the invention, a level shifter comprises a first PMOS transistor, a second PMOS transistor, a first NMOS transistor, a second NMOS transistor, an input node, a control circuit and an output node. An electrode of the first PMOS transistor is provided with a voltage having a first voltage level, another electrode of the first PMOS transistor is coupled to a first node and a gate of the first PMOS transistor is coupled to a second node. An electrode of the second PMOS transistor is provided with the voltage having the first voltage level, another electrode of the second PMOS transistor is coupled to the second node, and a gate of the second PMOS transistor is coupled to the first node. The first NMOS transistor is an intrinsic-type transistor. An electrode of the first NMOS transistor is coupled to the first node, another electrode of the first NMOS transistor is provided with a first enable signal, and a gate of the first NMOS transistor is coupled to a first control signal. The second NMOS transistor is an inintrinsic-type transistor. An electrode of the second NMOS transistor is coupled to the second node, another electrode of the second. NMOS transistor is provided with a second enable signal having a logic level that is an inverse of that of the first enable signal, and a gate of the second NMOS transistor is coupled to a second control signal. The input node is configured to receive an input signal having a second voltage level or a third voltage level. The control circuit is driven by the second voltage level and configured to generate the first control signal and the second control signal according to the input signal. The output node is configured to output an output signal having the first voltage level or the third voltage level in response to the input signal. When the first NMOS transistor is turned on to charge the first node and after a first predetermined period of time, the first NMOS transistor is turned off in response to the first control signal, and when the second NMOS transistor is turned on to charge the second node and after a second predetermined period of time, the second NMOS transistor is turned off in response to the second control signal.

According to another embodiment of the invention, a level shifter comprises a first PMOS transistor, a second PMOS transistor, a first NMOS transistor, a second NMOS transistor, an input node, a circuit and an output node. An

LEVEL SHIFTER AND SEMICONDUCTOR DEVICE

CROSS REFERENCE TO RELATED APPLICATIONS

This Application claims priority of Japanese Patent Application No. 2018-031480, filed on Feb. 26, 2018, the entirety of which is incorporated by reference herein.

BACKGROUND OF THE INVENTION

Field of the Invention

The invention relates to a level shifter, and more particularly to a level shifter (voltage level conversion circuit) configured in a semiconductor memory device, such as a flash memory.

Description of the Related Art

As semiconductors are miniaturized by design, the operating voltage needed to drive a semiconductor element is also being reduced, and the voltage (Vdd) of the power supplied to a semiconductor device is also being reduced. For example, the voltage level of the power supplied by an external device can be reduced from 3.3V to 2.5V or 1.8V. On the other hand, the internal circuit of a semiconductor memory device, such as a flash memory, may require a variety of different power levels, and sometimes may also require a high voltage that is higher than the voltage of the supplied power. Therefore, a voltage generating circuit, which may comprise a charge-pump circuit, a level shifter, etc. (Reference 1), for boosting up the voltage level of the power supplied by an external device to a desired voltage level is usually configured inside of the semiconductor device.

FIG. 1 shows an exemplary circuit diagram of a conventional level shifter. For example, the high voltage HV obtained by raising the voltage Vdd (the voltage of the supplied power source) is provided to a pair of PMOS transistors MVP_1 and MVP_2 that are cross-coupled and driven by high voltages. The pair of NMOS transistors MVN_1 and MVN_2 that are cross-coupled and driven by high voltages are coupled to the PMOS transistors MVP_1 and MVP_2, and the signals ENb and EN generated by the inverters LV which are driven by the voltage Vdd are respectively provide to the gates of the NMOS transistors MVN_1 and MVN_2. The input signal having a ground voltage GND (low voltage level) or the voltage Vdd (high voltage level) is provided to the input node HVEN, and the inverters LV generate output signals ENb and EN in response to the input signal. The node MOUT is coupled to the input gates of the inverter driven by high voltages (the transistors MVP_3 and MVN_3 driven by high voltages), Id the signal obtained by converting the voltage Vdd of the input signal to the high voltage HV is output by the output node HVOUT.

Reference

Reference 1. Japan patent 2017-228325

BRIEF SUMMARY OF THE INVENTION

Problems to be Solved

In the conventional level shifter shown in FIG. 1, there is no margin for the high-voltage driven transistors MVP_1, MVP_2, MVN_1 and MVN_2 to operate under low voltage. In other words, the threshold voltage of the high-voltage driven transistors is relative electrode of the first PMOS transistor is provided with a voltage having a first voltage level, another electrode of the first PMOS transistor is coupled to a first node and a gate of the first PMOS transistor is coupled to a second node. An electrode of the second PMOS transistor is provided with the voltage having the first voltage level, another electrode of the second PMOS transistor is coupled to the second node, and a gate of the second PMOS transistor is coupled to the first node. The first NMOS transistor is an intrinsic-type transistor. An electrode of the first NMOS transistor is coupled to the first node, another electrode of the first NMOS transistor is provided with a first enable signal, and a gate of the first NMOS transistor is provided with a second voltage level. The second NMOS transistor is an intrinsic-type transistor. An electrode of the second NMOS transistor is coupled to the second node, another electrode of the second NMOS transistor is provided with a second enable signal having a logic level that is an inverse of that of the first enable signal, and a gate of the second NMOS transistor is provided with the second voltage level. The input node is configured to receive an input signal having the second voltage level or a third voltage level. The circuit is driven by the second voltage level and configured to generate the first enable signal and the second enable signal. The output node is configured to output an output signal having the first voltage level or the third voltage level in response to the input signal.

Effect of the Invention

According to the embodiment of the invention, because the first control signal and the second control signal are used to control operations of the intrinsic-type first NMOS transistor and second NMOS transistor, the leakage currents from the first node and the second node can be suppressed at the time when the first node and the second are rapidly charged or discharged. In addition, according to the embodiments of the invention, because the intrinsic-type first NMOS transistor and second NMOS transistor are used, the first node and the second node can be rapidly charged or discharged as compared to the case when using the normal NMOS transistors.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

In the following paragraphs, several embodiments of the invention will be introduced with reference to the figures. In the embodiments of the invention, the level shifter configured in a flash memory will be introduced as an example to illustrate the configuration of a level shifter.

Embodiments

Figure 1:
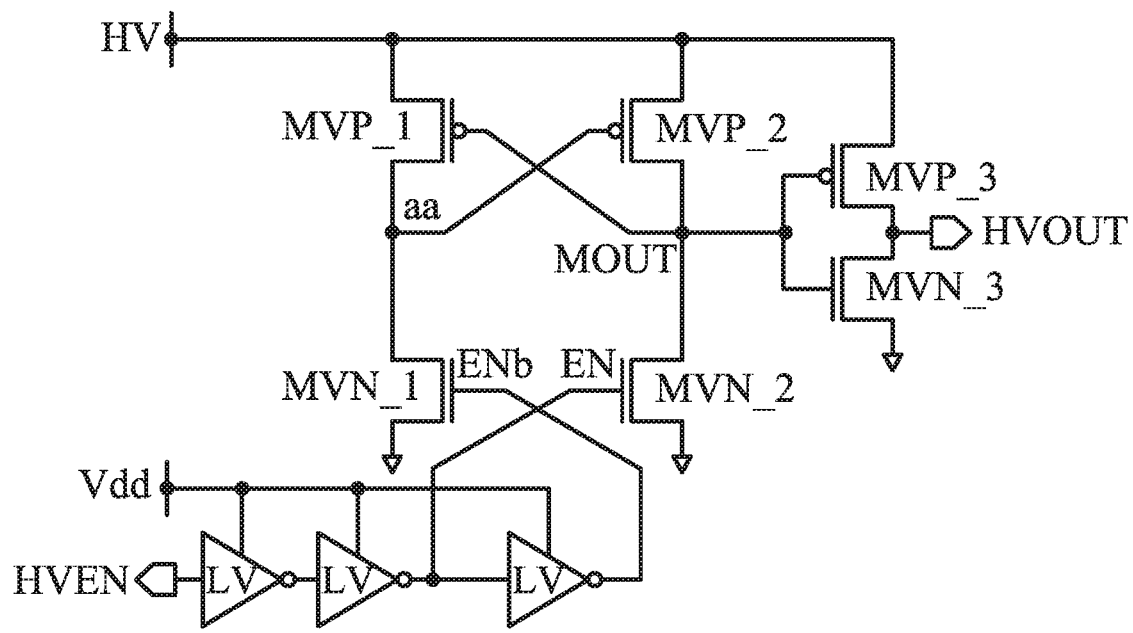
FIG. 1 shows an exemplary circuit diagram of a conventional level shifter.
Figure 2:
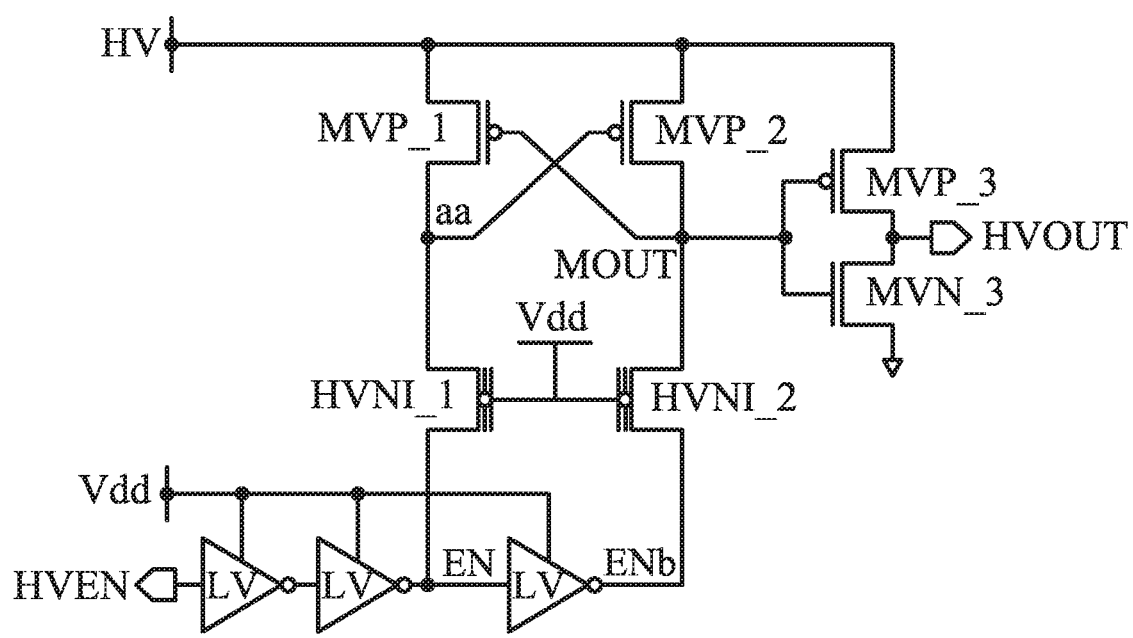
FIG. 2 is an exemplary circuit diagram of an intrinsic level shifter according to a first embodiment of the invention.

As shown in FIG. 2, the intrinsic-type NMOS transistor HVNI_1 is coupled between the transistor MVP_1 and the node providing the signal EN, the intrinsic-type NMOS transistor HVNI_2 is coupled between the transistor MVP_2 and the node providing the signal ENb, and the gates of the transistors HVNI_1 and HVNI_2 are provided with the voltage Vdd of the supplied power. The intrinsic-type transistor is a transistor in which the channel region is not doped with impurities, and its ideal threshold is 0 volt (V), but the actual threshold is close to 0 volt, and has a margin of operation at a low voltage.

Figure 3:
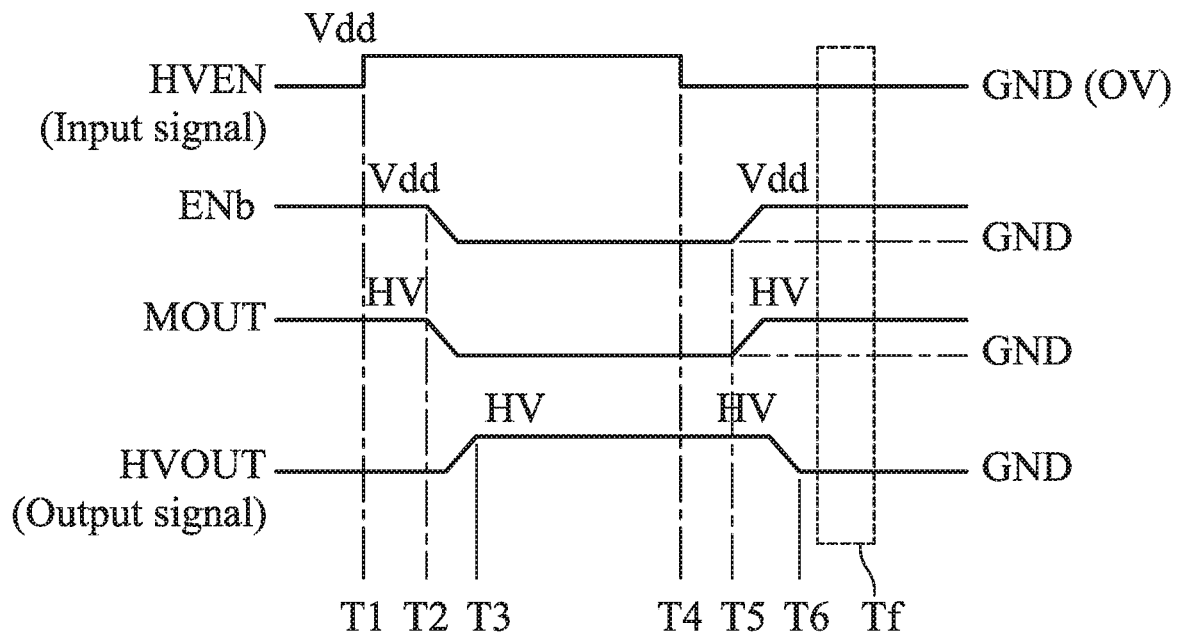
FIG. 3 is a timing diagram of multiple signals of an intrinsic-type level shifter according to the first embodiment of the invention.

Referring to FIG. 3, at the time T1, the voltage level of the input signal at the node HVEN is changed from the GNB level to the Vdd level. At the time T2, the voltage level of the signal ENb is changed from the Vdd level to the GND level, and the voltage level at the node MOUT is discharged to the GND level of the ground voltage via the transistor HVNI_2. Meanwhile, since the node MOUT is discharged via the inverter LV, the pull-down strength is sufficient to quickly pull down the voltage at the node MOUT. Therefore, the node MOUT can be rapidly discharged. At the time T3, the signal of the high voltage HV is output at the node HVOUT. On the other hand, as to the node aa, once the voltage level at the node MOUT is changed to the GND level, the transistor MVP_1 is turned on and the node as is charged by the high voltage HV. Therefore, the transistor MVP_2 is turned off and a through current will not flow from the high voltage HV through the transistor MVP_2.

Next, at the time T4, the voltage level of the input signal at the node HVEN is changed from the Vdd level to the GND level. At the time T5, the voltage level of the signal EN is changed from the Vdd level to the GND level, and the node aa is discharged to the GND level of the ground voltage via the transistor HVNI_1. In addition, the voltage level of the signal ENb is changed from the GND level to the Vdd level, the node MOUT is charged to the Vdd level via the transistor HVNI_2. After that, since the voltage level at the terminal aa is changed to the GND level, the transistor MVP_2 is turned on and the node MOUT is charged by the high voltage HV. Even if the level of the high voltage HV is Vdd, since the node MOUT has been charged to the Vdd level, the transistors MVP_3 and MVN_3 may be turned off and turned on, respectively. Therefore, the node MOUT can be rapidly charged. At the time T6, the GND signal is output at the output node HVOUT.

Figure 4:
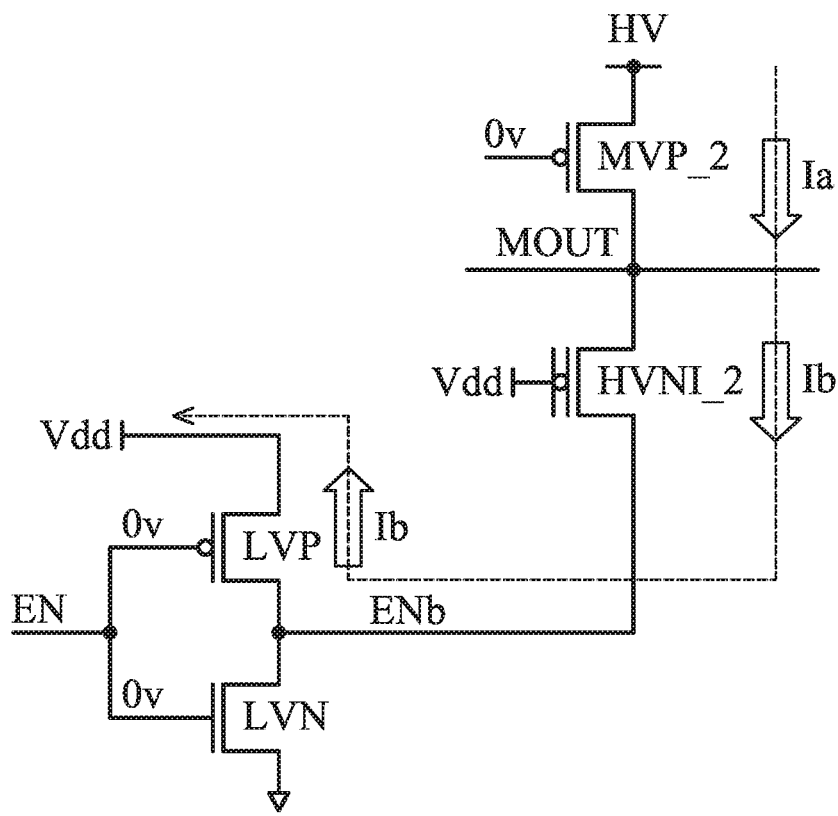
FIG. 4 is schematic diagram showing generation of the leakage current of the intrinsic level shifter according to the first embodiment of the invention.

For the level shifter illustrated in the first embodiment of the invention, during the period of time when the voltage level of the input signal is changed from Vdd to GND and the period of time Tf when the voltage level of the output signal is changed from Vdd to GND, when the level of the supplied high voltage HV is higher than the Vdd level, the through current from the high voltage HV at the node MOUT to the Vdd voltage at the inverter LV will be generated. As shown in FIG. 4, the voltage at the node MOUT is charged to the level of the high voltage HV by the drain current Ia of the transistor MVP_2. Once the level of high voltage HV is greater than Vdd level (HV>Vdd), a discharge path from the node MOUT to the voltage Vdd via the transistor HVNI_2 and the PMOS transistor LVP of the inverter LV will be generated, thereby the leakage current Ib will be generated and the problem of increasing power consumption of the level shifter worsens.

Figure 5:
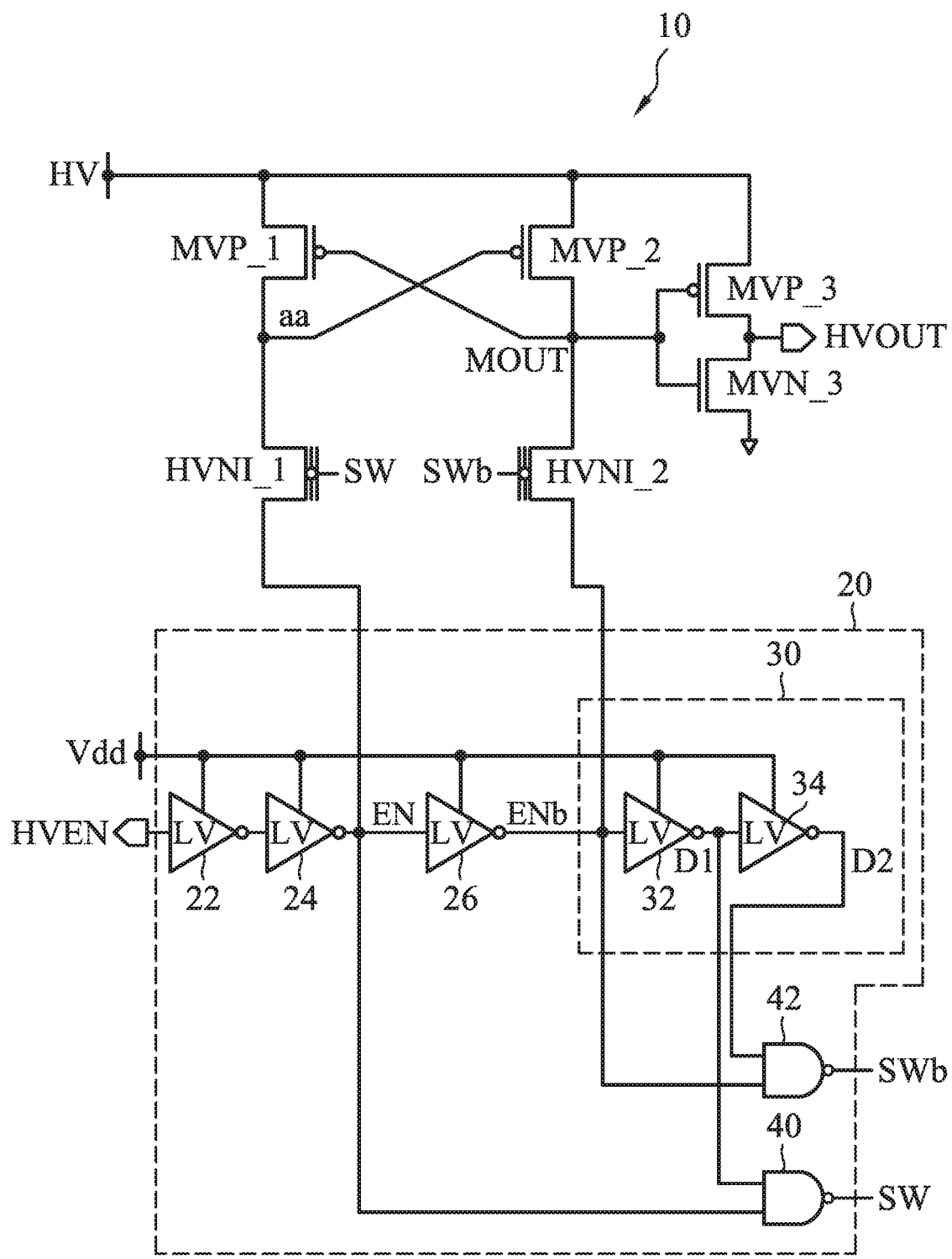
FIG. 5 is an exemplary circuit diagram of an intrinsic level shifter according to a second embodiment of the invention.

According to a second embodiment of the invention, a level shifter capable of suppressing the leakage current Ib as illustrated in the first embodiment is proposed. FIG. 5 is an exemplary circuit diagram of an intrinsic level shifter according to a second embodiment of the invention. The signal having Vdd level or GND level is input to the input node HVEN of the level shifter 10, and the signal having a high voltage HV level or GND level is output at the output node HVOUT. However, when the supplied high voltage HV is the voltage Vdd, the signal output at the output node HVOUT has a Vdd level.

The level shifter 10 comprises high-voltage driven PMOS transistors MVP_1, MVP_2 and MVP_3, NMOS transistor MVN_3, intrinsic-type NMOS transistors HVNI_1 and HVNI_2 and the control circuit 20 that is driven by the voltage Vdd.

The high voltage HV is provided to the source of the PMOS transistors MVP_1, MVP_2 and MVP_3, where the high voltage HV may be obtained by boosting the voltage Vdd via a circuit such as a charge pump. The gates of PMOS transistors MVP_1 and MVP_2 may be cross-coupled to the drain of each other. In other words, the gate of the PMOS transistor MVP_1 is coupled to the drain (the node MOUT) of the PMOS transistor MVP_2, and the gate of the PMOS transistor MVP_2 is coupled to the drain (the node aa) of the PMOS transistor MVP_1.

An electrode of the intrinsic-type NMOS transistor HVNI_1 is coupled to the drain (the node aa) of the PMOS transistor MVP_1, another electrode of the intrinsic-type NMOS transistor HVNI_1 is combined with a node providing the signal EN, and the gate of the intrinsic-type NMOS transistor HVNI_1 is provided with the control signal SW. In addition, an electrode of the intrinsic-type NMOS transistor HVNI_2 is coupled to the drain (the node MOUT) of the PMOS transistor MVP_2, another electrode of the intrinsic-type NMOS transistor HVNI_2 is combined with a node providing the signal ENb, and the gate of the intrinsic-type NMOS transistor HVNI_2 is provided with the control signal SWb. The intrinsic-type NMOS transistors HVNI_1 and HVNI_2 are the transistors in which the channel region is not doped with impurities and have threshold voltage close to 0 volt, and have a margin of operation at a low voltage.

The PMOS transistor MPV_3 and the NMOS transistor MVN_3 together form an inverter that is driven by high voltages. The input node of the inverter is combined with the node MOUT and the output node of the inverter is combined with the output node HVOUT. In response to the input signal, the output signal having a level of the high voltage HV or the GND voltage is output at the output node HVOUT.

The control circuit 20 is a circuit driven by the voltage Vdd. The control circuit 20 is formed by multiple inverters LV 22, 24 and 26, a delay circuit 30 and the NAND logic gates 40 and 42 for generating the control signals SW and SWb. The input node of the inverter LV 22 is combined with the input node HVEN and the input node HVEN is provided with the input signal having the Vdd level (high voltage level) or the GND level (low voltage level).

The inverters LV 22, 24 and 26 are coupled in serial. The inverter 24 outputs the signal EN having the same logic level as the input signal. The signal EN is provided to the source of the intrinsic-type NMOS transistor HVNI_1. The inverter 26 outputs the signal ENb having a logic level that is the inverse of that of the input signal. The signal ENb is provided to the source of the intrinsic-type NMOS transistor HVNI_2.

The delay circuit 30 is configured to delay the input signal for a predetermined period of time to generate delay signals D1 and D2. The delay circuit 30 is formed by, for example, multiple inverters coupled in serial. Although there are two inverters LV 32 and 34 shown in this embodiment, the number of inverters is flexible and can be selected according to the required delay time. The inverter LV 32 is configured to generate a delay signal D1 having the same logic level as the input signal. The inverter LV 34 is configured to generate a delay signal D2 having a logic level that is the inverse of that of the input signal.

The NAND logic gate 40 is configured to receive the signal EN and the delay signal D1 and generate a control signal SW. The generated control signal SW is provided to the gate of the intrinsic-type NMOS transistor HVNI_1. The NAND logic gate 42 is configured to receive the signal ENb and the delay signal D2 and generate a control signal SWb. The generated control signal SWb is provided to the gate of the intrinsic-type NMOS transistor HVNI_2.

When the signal EN has the GND level and the control signal SW has the Vdd level, the intrinsic-type NMOS transistor HVNI_1 is turned on, and the node aa is discharged to the GND level via the intrinsic-type NMOS transistor HVNI_1. When the signal EN has the Vdd level and the control signal SW has the Vdd level, the intrinsic-type NMOS transistor HVNI_1 is turned on, and the node aa is charged to the Vdd level via the intrinsic-type NMOS transistor HVNI_1. After that, when the level of the voltage at the node MOUT becomes the GND level, the PMOS transistor MVP_1 is turned on and the aa is further charged to the level of the high voltage HV via the PMOS transistor MVP_1. In addition, when the control signal SW has the GND level the intrinsic-type NMOS transistor HVNI_1 is turned off such that the node aa is disconnected from the control circuit 20.

On the other hand, when the signal ENb has the GND level and the control signal SWb has the Vdd level, the intrinsic-type NMOS transistor HVNI_2 is turned on, and the node MOUT is discharged to the GND level via the intrinsic-type NMOS transistor HVNI_2. When the signal ENb has the Vdd level and the control signal SWb has the Vdd level, the intrinsic-type NMOS transistor HVNI_2 is turned on, and the node MOUT is charged to the Vdd level via the intrinsic-type NMOS transistor HVNI_2. After that, when the level of the voltage at the node aa becomes the GND level, the PMOS transistor MVP_2 is turned on and the node MOUT is further charged to level of the high voltage HV via the PMOS transistor MVP_2. In addition, when the control signal SWb has the GND level, the intrinsic-type NMOS transistor HVNI_2 is turned off, such that the node MOUT is disconnected from the control circuit 20.

In the level shifter 10 as illustrated above, when the level of the input signal is Vdd, the high voltage HV signal is output at the output node HVOUT. When the level of the input signal is GND, the ground voltage signal is output at the output node HVOUT. However, when the circuit such as the charge pump is not enabled and the provided high voltage HV is just the voltage Vdd of the supplied power source, the voltage Vdd is output at the output node HOUT of the level shifter 10.

Figure 6:
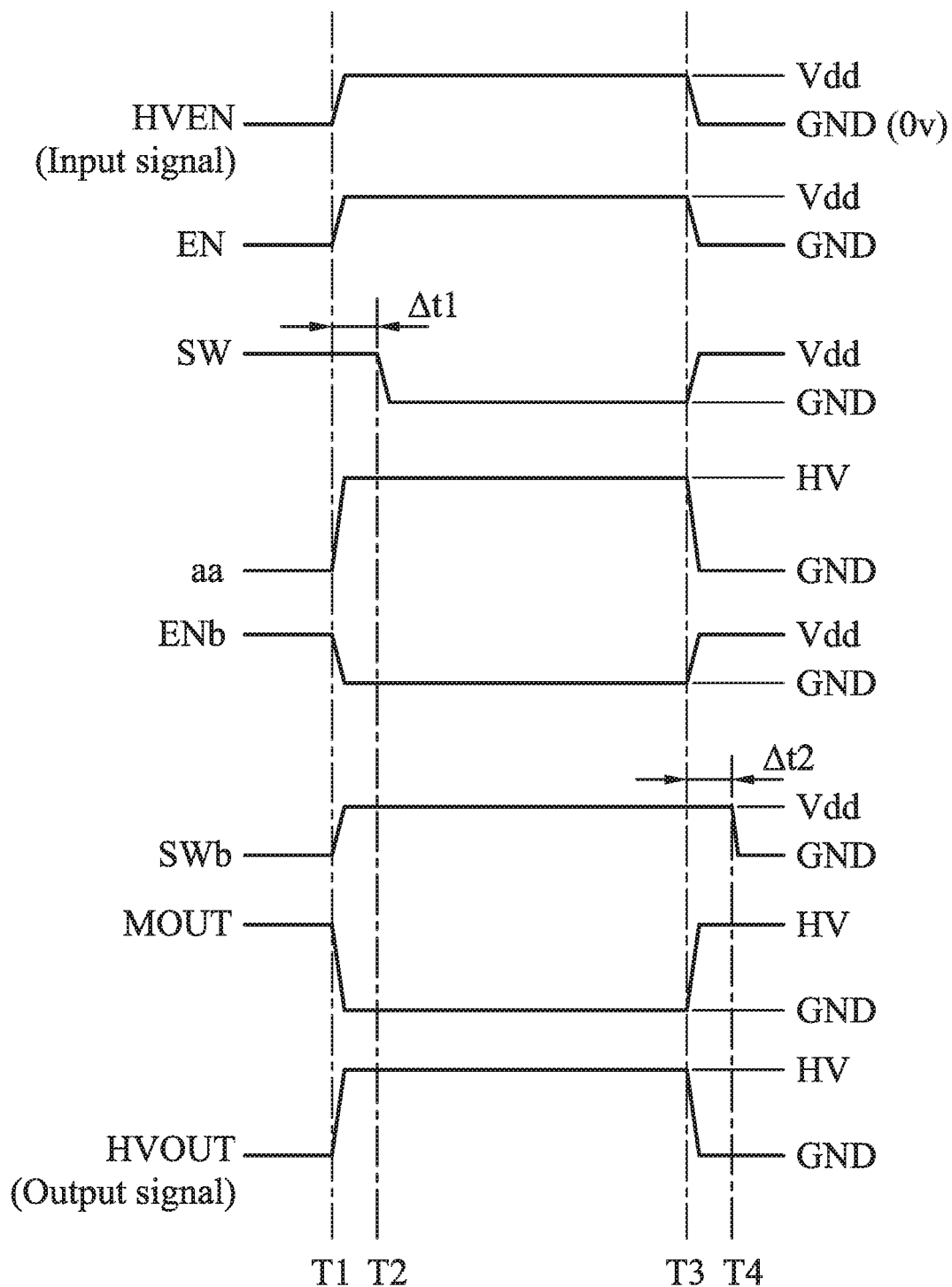
FIG. 6 is a timing diagram of multiple signals of an intrinsic-type level shifter according to the second embodiment of the invention.

Next, referring to FIG. 6, operations of the level shifter will be illustrated accompanying with the timing diagram shown in FIG. 6. At the time T1, the voltage level of the input signal is changed from the GND level to the Vdd level and the voltage level of the signal EN becomes the Vdd level. At this time, since the delay signal D1 input to the NAND logic gate 40 has the GND level (low voltage level), the control signal SW is kept at the Vdd level (high voltage level). Therefore, when the level of the signal En is changed to the Vdd level at the time T1, the NMOS transistor HVNI_1 is turned on and the node aa is charged by the voltage Vdd via the signal EN.

On the other hand, when the level of the signal ENb is changed to the GND level, the level of the control signal SWb output by the NAND logic gate 42 is changed to the Vdd level. In response to this change, the NMOS transistor HVNI_2 is turned on, the level of the voltage at the node MOUT is changed to the GND level, the PMOS transistor MVP_1 is turned on and the level of the voltage at the node aa is raised to the level of the high voltage HV.

At the time T2 after the time period Δt1 elapses from time T1, the level of the delay signal D1 output by the delay circuit 30 is changed from the GND level to the Vdd level, and the level of the control signal SW is changed from the Vdd level to the GND level. The time period Δt1 is the delay time period set by the delay circuit 30. In other words, the tune period Δt1 is the charge tune for being charged via the NMOS transistor HVNI_1. In response to the level of the control signal SW being changed from the Vdd level to the GND level, the NMOS transistor HVNI_1 is turned off, such that the node aa is disconnected from the signal EN and no current can pass though, thereby preventing the leakage current from being generated from the high voltage HV at the node aa through the transistor HVNI_1 to the Vdd of the signal EN (the Vdd of the inverter 42). In the period from the time T2 to the time T3 that the level of the control signal SW becomes the Vdd level again, the transistor HVNI_1 is turned off. During this period, generation of the leakage current from the node aa to the inverter 24 can be prevented.

Next, at the time T3, the level of the input signal is changed from the Vdd level to the GND level, the level of the signal EN is changed from the Vdd level to the GND level, the level of the control signal SW is changed from the GND level to the Vdd level, the transistor HVNI_1 is turned on, the level of the voltage at the node aa is pulled down to the GND level of the signal EN the transistor MVP_2 is turned on and the level of the voltage at the node MOUT is pulled up by the high voltage HV.

In addition, at the time T3, since the level of the delay signal D2 input to the NAND logic gate 42 is the GND level (the low voltage level), the level of the control signal SWb is kept at the Vdd level (the high voltage level). Therefore, the NMOS transistor HVNI_2 is turned on at the time when the level of the signal ENb becomes the Vdd level, and the node MOUT is charged by the voltage Vdd via the signal ENb.

At the time T4 after the time period Δt2 elapses from time T3, the level of the delay signal D2 output by the delay circuit 30 is changed from the GND level to the Vdd level, and the level of the control signal SWb is changed from the Vdd level to the GND level. The time period Δt2 is the delay time period set by the delay circuit 30. In other words, the time period Δt2 is the charge time for being charged via the NMOS transistor HVNI_2. In response to the level of the control signal SWb being changed from the Vdd level to the GND level, the NMOS transistor HVNI_2 is turned off, such that the node MOUT is disconnected from the signal ENb and no current can pass though, thereby preventing the leakage current from being generated from the high voltage HV at the node MOUT through the transistor HVNI_2 to the Vdd of the signal ENb (the Vdd of the inverter 26).

As discussed above, according to the embodiments of the invention, when the level of the voltages at the nodes aa and MOUT is pulled up to the level of the high voltage HV, the intrinsic-type NMOS transistors HVNI_1 and HVNI_2 are utilized for charging Vdd, thereby the level shifter can operate in a high speed. In addition, by controlling the intrinsic-type NMOS transistors, the leakage current from the high voltage HV to the voltage Vdd can be cut off, thereby reducing the power consumption of the level shifter.

Figure 7:
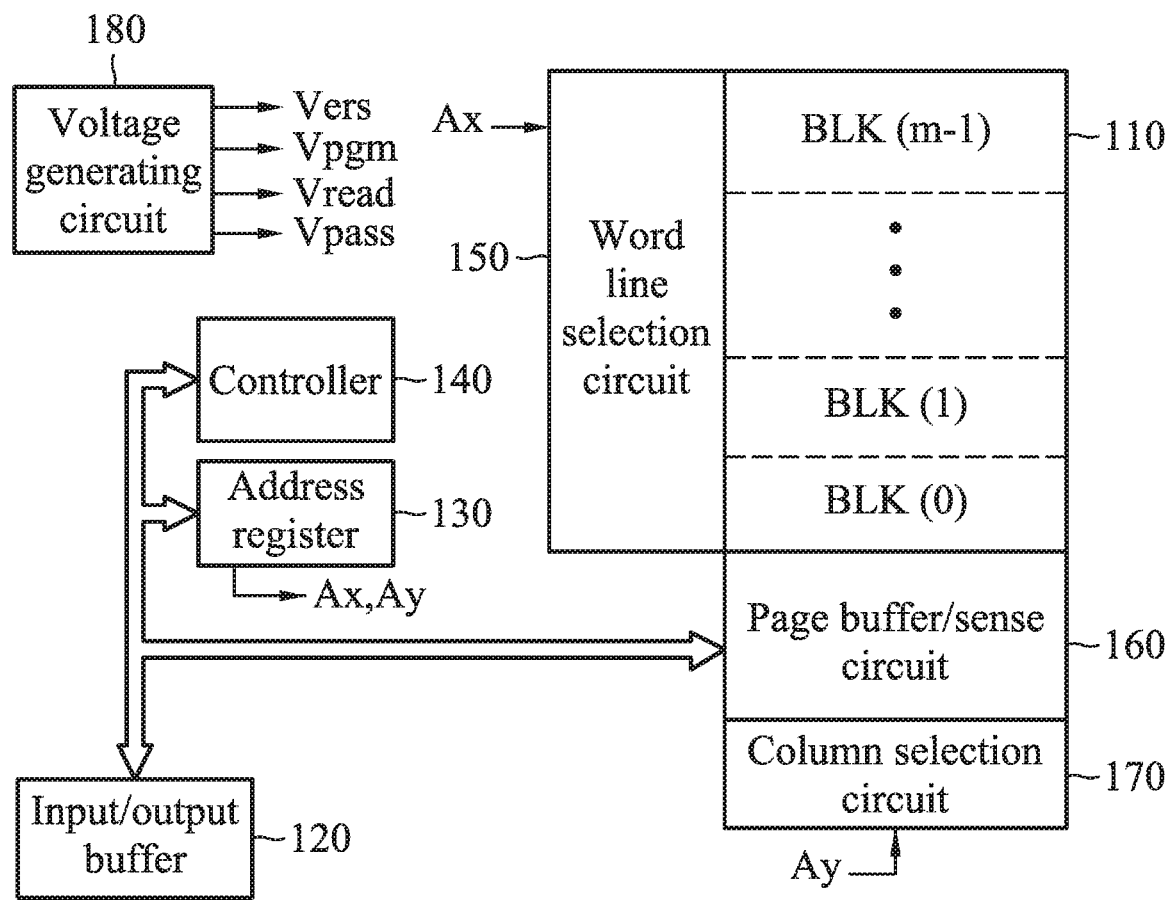
FIG. 7 is an exemplary configuration of a flash memory comprising an intrinsic-type level shifter according to an embodiment of the invention.

The level shifter as illustrated in the first and second embodiments of the invention can be configured in, for example, a flash memory. FIG. 7 shows an exemplary flash memory configuration according to an embodiment of the invention. The flash memory 100 may comprise a memory cell array 110, an input/output buffer 120, an address register 130, a controller 140, a word line selection circuit 150, a page buffer/sense circuit 160, a column selection circuit 170 and a voltage generating circuit 180. The memory cell array 110 comprises a plurality of memory cells arranged in a form of an array. The input/output buffer 120 is connected to an external input/output terminal and configured to buffer the input/output data. The address register 130 is configured to receive address data from the input/output buffer 120. The controller 140 is configured to receive command data from the input/output buffer 120, receive control signals from an external device and control operations of each device. The word line selection circuit 150 is configured to receive information regarding row address Ax from the address register 130, and select memory blocks BLK(0), BLK(1), . . . BLK(m−1) or select word lines based on the decoding result of the row address Ax. The page buffer/sense circuit 160 is configured to maintain the data read from the page selected by the word line selection circuit 150 and maintain the input data to be programmed into the selected page. The column selection circuit 170 is configured to receive information regarding column address Ay from the address register 130 and select the data in the page buffer/sense circuit 160 based on the decoding result of the column address Ay. The voltage generating circuit 180 is configured to generate a variety of voltages required for reading data, programming data, erasing data, and so on (such as the program voltage Vpgm, the pass voltage Vpass, the read pass voltage Vread, the erase voltage Vers . . . etc.).

The voltage generating circuit 180 comprises a charge pump circuit and a level shifter. The charge pump circuit is configured to boost the voltage Vdd provided by an external device. The level shifter is configured to output the high voltage boosted by the charge pump circuit. The level shifter is configured to generate multiple voltages, such as the step voltage for the program operation according to the Incremental Step Pulse Program (ISPP) and the step voltage for the erase operation according to the Incremental Step Pulse Erase (ISPE), or the likes, in response to the control signals of the controller 140.

In the first and second embodiments as illustrated above, the level shifters capable of being applied in the flash memory are shown. However, the invention should not be limited thereto. It should be understood that the level shifters as illustrated above can also be applied in any other semiconductor devices that needs the voltages other than the Vdd voltage.

While the invention has been described by was of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A level shifter, comprising:
    a first PMOS transistor, wherein an electrode of the first PMOS transistor is provided with a voltage having a first voltage level, another electrode of the first PMOS transistor is coupled to a first node and a gate of the first PMOS transistor is coupled to a second node;
    a second PMOS transistor, wherein an electrode of the second PMOS transistor is provided with the voltage having the first voltage level, another electrode of the second PMOS transistor is coupled to the second node, and a gate of the second PMOS transistor is coupled to the first node;
    a first NMOS transistor, which is an intrinsic-type transistor, wherein an electrode of the first NMOS transistor is coupled to the first node, another electrode of the first NMOS transistor is provided with a first enable signal, and a gate of the first NMOS transistor is coupled to a first control signal;
    a second NMOS transistor, which is an intrinsic-type transistor, wherein an electrode of the second NMOS transistor is coupled to the second node, another electrode of the second NMOS transistor is provided with a second enable signal having a logic level that is an inverse of that of the first enable signal, and a gate of the second NMOS transistor is coupled to a second control signal;
    an input node, configured to receive an input signal having a second voltage level or a third voltage level;
    a control circuit, driven by the second voltage level and configured to generate the first control signal and the second control signal according to the input signal; and
    an output node, configured to output an output signal having the first voltage level or the third voltage level in response to the input signal,
    wherein when the first NMOS transistor is turned on to charge the first node and after a first predetermined period of time, the first NMOS transistor is turned off in response to the first control signal, and when the second NMOS transistor is turned on to charge the second node and after a second predetermined period of time, the second NMOS transistor is turned off in response to the second control signal, and
    wherein the control circuit comprises a delay circuit configured to generate the first control signal and the second control signal according to the input signal, and wherein the delay circuit generates the first control signal and the second control signal according to the charge time of the first node and the second node for being charged via the first NMOS transistor and the second NMOS transistor.

2. The level shifter as claimed in claim 1, wherein when a voltage level of the first enable signal is changed from the third voltage level to the second voltage level, the first node is discharged by the third voltage level in response to the first control signal, and when a voltage level of the second enable signal is changed from the third voltage level to the second voltage level, the second node is discharged by the third voltage level in response to the second control signal.

3. The level shifter as claimed in claim 1, wherein when a voltage level of the first enable signal is changed from the third voltage level to the second voltage level, the first node is charged by the second voltage level in response to the first control signal, and when a voltage level of the second enable signal is changed from the third voltage level to the second voltage level, the second node is charged by the second voltage level in response to the second control signal.

4. The level shifter as claimed in claim 1, wherein when a voltage level of the first enable signal is changed from the second voltage level to the third voltage level, after the first node is charged, the first node is disconnected from the first enable signal in response to the first control signal, and when a voltage level of the second enable signal is changed from the second voltage level to the third voltage level, after the second node is charged, the second node is disconnected from the second enable signal in response to the second control signal.

5. The level shifter as claimed in claim 1, wherein the control circuit is configured to generate the first enable signal and the second enable signal according to the input signal.

6. The level shifter as claimed in claim 1, wherein the delay circuit further comprises a first logic circuit and a second logic circuit, the first logic circuit is configured to generate the first control signal according to the first enable signal and the second logic circuit is configured to generate the second control signal according to the second enable signal.

7. A semiconductor device, comprising:
    a level shifter, wherein the level shifter comprises:
    a first PMOS transistor, wherein an electrode of the first PMOS transistor is provided with a voltage having a first voltage level, another electrode of the first PMOS transistor is coupled to a first node and a gate of the first PMOS transistor is coupled to a second node;
    a second PMOS transistor, wherein an electrode of the second PMOS transistor is provided with the voltage having the first voltage level, another electrode of the second PMOS transistor is coupled to the second node, and a gate of the second PMOS transistor is coupled to the first node;
    a first NMOS transistor, which is an intrinsic-type transistor, wherein an electrode of the first NMOS transistor is coupled to the first node and another electrode of the first NMOS transistor is provided with a first enable signal, and a gate of the first NMOS transistor is coupled to a first control signal;
    a second NMOS transistor, which is an intrinsic-type transistor, wherein an electrode of the second NMOS transistor is coupled to the second node and another electrode of the second NMOS transistor is provided with a second enable signal having a logic level that is an inverse of that of the first enable signal, and a gate of the second NMOS transistor is coupled to a second control signal;

an input node, configured to receive an input signal having a second voltage level or a third voltage level;

an output node, configured to output an output signal having the first voltage level or the third voltage level in response to the input signal; and a control circuit, driven by the second voltage level and configured to generate the first control signal and the second control signal according to the input signal, wherein when the first NMOS transistor is turned on to charge the first node and after a first predetermined period of time, the first NMOS transistor is turned off in response to the first control signal, and when the second NMOS transistor is turned on to charge the second node and after a second predetermined period of time, the second NMOS transistor is turned off in response to the second control signal, and wherein the control circuit comprises a delay circuit configured to generate the first control signal and the second control signal according to the input signal, and wherein the delay circuit generates the first control signal and the second control signal according to the charge time of the first node and the second node for being charged via the first NMOS transistor and the second NMOS transistor.

8. The semiconductor device as claimed in claim 7, wherein when a voltage level of the first enable signal is changed from the third voltage level to the second voltage level, the first node is discharged by the third voltage level in response to the first control signal, and when a voltage level of the second enable signal is changed from the third voltage level to the second voltage level, the second node is discharged by the third voltage level in response to the second control signal.

9. The semiconductor device as claimed in claim 7, wherein when a voltage level of the first enable signal is changed from the third voltage level to the second voltage level, the first node is charged by the second voltage level in response to the first control signal, and when a voltage level of the second enable signal is changed from the third voltage level to the second voltage level, the second node is charged by the second voltage level in response to the second control signal.

10. The semiconductor device as claimed in claim 7, wherein when a voltage level of the first enable signal is changed from the second voltage level to the third voltage level, after the first node is charged, the first node is disconnected from the first enable signal in response to the first control signal, and when a voltage level of the second enable signal is changed from the second voltage level to the third voltage level, after the second node is charged, the second node is disconnected from the second enable signal in response to the second control signal.

11. The semiconductor device as claimed in claim 7, wherein the control circuit is configured to generate the first enable signal and the second enable signal according to the input signal.

12. The semiconductor device as claimed in claim 7, wherein the delay circuit further comprises a first logic circuit and a second logic circuit, the first logic circuit is configured to generate the first control signal according to the first enable signal and the second logic circuit is configured to generate the second control signal according to the second enable signal.

13. The semiconductor device as claimed in claim 7, wherein a gate of the first NMOS transistor is provided with the second voltage level, a gate of the second NMOS transistor is provided with the second voltage level, and wherein the level shifter further comprises:

a circuit, driven by the second voltage level and configured to generate the first enable signal and the second enable signal.

14. The level shifter as claimed in claim 13, wherein the first voltage level is the level after a voltage of a supplied power is boosted by a boost circuit, the second voltage level is the level of the voltage of the supplied power, and the third voltage level is the level of a ground voltage.

* * * * *